United States Patent [19]
Akari et al.

[11] Patent Number: 6,156,170
[45] Date of Patent: Dec. 5, 2000

[54] MAGNETRON SPUTTERING APPARATUS

[75] Inventors: Koichiro Akari; Toshimitsu Kohara, both of Takasago, Japan

[73] Assignee: Kabushiki Kaisha Kobe Seiko Sho (Kobe Steel, Ltd.), Kobe, Japan

[21] Appl. No.: 09/375,903

[22] Filed: Aug. 17, 1999

[30] Foreign Application Priority Data

Aug. 19, 1998 [JP] Japan .................................. 10-232927

[51] Int. Cl.$^7$ .................................................. C23C 14/34
[52] U.S. Cl. ................ 204/298.18; 204/298.16; 204/298.17; 204/298.19; 204/298.2; 204/298.22; 204/298.26
[58] Field of Search ......................... 204/298.26, 298.16, 204/298.19, 298.22, 298.18, 298.17, 298.2

[56] References Cited

U.S. PATENT DOCUMENTS

| | | | |
|---|---|---|---|
| 4,880,515 | 11/1989 | Yoshikawa et al. | 204/298.16 |
| 5,022,978 | 6/1991 | Hensel et al. | 204/298.19 |
| 5,196,105 | 3/1993 | Feuerstein et al. | 204/298.26 |
| 5,277,778 | 1/1994 | Daube et al. | 204/298.19 |
| 5,284,564 | 2/1994 | Maass | 204/298.2 |
| 5,556,519 | 9/1996 | Teer | 204/298.26 |
| 5,961,773 | 10/1999 | Ichimura et al. | 204/298.16 |

FOREIGN PATENT DOCUMENTS

| | | |
|---|---|---|
| 0 115 119 | 8/1984 | European Pat. Off. . |
| 0 537 011 | 4/1993 | European Pat. Off. . |
| 0 884 761 | 12/1998 | European Pat. Off. . |
| WO 91/14797 | 10/1991 | WIPO . |

*Primary Examiner*—Alan Diamond
*Assistant Examiner*—Daborah Chacko-Davis
*Attorney, Agent, or Firm*—Oblon, Spivak, McClelland, Maier & Neustadt, P.C.

[57] ABSTRACT

This invention provides a magnetron sputtering apparatus for forming a thin film on a substrate by adhering metal atoms or ions evaporated from a magnetron evaporation source to the substrate, which comprises at least one magnetron evaporation source and at least one auxiliary magnetic pole provided on the circumference of the substrate to generate magnetic lines of force surrounding the substrate. According to this invention, only one kind of magnetron magnetic field structure suffices for the magnetron evaporation sources, a desired sealing magnetic field can be formed regardless of the number or arrangement of the magnetron evaporating sources, and the form of the sealing magnetic field can be easily changed.

15 Claims, 7 Drawing Sheets

MAGNETRON SPUTTERING APPARATUS

BACKGROUND OF THE INVENTION

1. Field of the Invention

This invention relates to a magnetron sputtering apparatus for forming a thin film in vacuum by means of magnetron sputtering and, particularly, a magnetron sputtering apparatus capable of activating the ionization in a plasma to increase the ion current to a substrate.

2. Description of the Prior Art

In a conventional magnetron sputtering apparatus for forming a thin film in vacuum by means of magnetron sputtering, for example, a magnetron evaporation source 34 having an inside magnetic pole 31, a ring-like outside magnetic pole 32 and a target 33 is arranged so as to surround the circumference of a substrate 36 within a vacuum chamber 35, as shown in FIG. 13, and magnetic lines of force 38 is generated so as to successively connect the outside magnetic poles 32 of the adjacent magnetron evaporation sources 34 to surround the circumference of the substrate 36 by the magnetic lines of force 38 by differing the polarities of the respective outside magnetic poles 32 of the mutually adjacent magnetron evaporation sources 34, whereby the plasma generated by a glow discharge is sealed around the substrate 36, and the ionization of a metal atom evaporated from the magnetron evaporation source 34 is activated to form a metal thin film of high density on the substrate 36 (Japanese Patent Publication No. 5-505215; hereby fully incorporated by reference).

However, the conventional method required two types of magnetron evaporation sources with different polarities of an outside magnetic pole 32 and an inside magnetic pole 31 since it is necessary to differ the magnetic poles of the outside magnetic poles 32 of the mutually adjacent magnetron evaporation sources 34 in order to generate the magnetic lines of force 38 so as to successively connect the outside magnetic pole 32 of each magnetron evaporation source 34 to surround the circumference of the substrate 36 by the magnetic lines of force 38.

The shape or intensity of magnetic field was also varied depending on the number or arrangement of the magnetron evaporation sources 34 since the magnetic field for surrounding the substrate 36 was formed only by the magnetic lines of force 38 mutually connecting the magnetic poles 32 of the magnetron evaporation sources 34. In order to provide a desired shape or intensity of magnetic field necessary to sufficiently seal the plasma around the substrate 36, conversely, the number or arrangement of the magnetron evaporation sources 34 was restricted. In a large-sized apparatus for processing a large substrate 36, for example, a number of magnetron evaporation sources 34 had to be arranged since a desired magnetic field can not be obtained unless the mutually adjacent magnetron evaporation sources 34 are arranged within a certain distance.

Further, once the arrangement of the magnetron evaporation sources 34 is determined, the shape of magnetic field is also determined, and it is difficult to change. Although the shape of magnetic field can be changed also in the prior arts by forming the magnetic pole of the magnetron evaporation source 34 of not a permanent magnet but a coil, the arrangement of a plurality of coils in the magnetron evaporation source 34 lead to the problems of the larger size and more complicated structure of the magnetron evaporation source 34.

SUMMARY OF THE INVENTION

This invention has been achieved to solve the above-mentioned problems. An object of this invention is to provide a sputtering apparatus capable of activating the ionization of metal atoms evaporated from a magnetron evaporation source by the sealing the plasma generated from the magnetron evaporation source around the substrate similarly to the prior arts and further improving the adhesion with the substrate or the membrane structure by a film formed on the substrate receiving the collision of the ion much more, in which one type of magnetron magnetic field structure suffices for the magnetron evaporation source, a desired sealing magnetic field can be formed regardless of the number and arrangement of the magnetron evaporation sources, and the form of the sealing magnetic field can be easily changed.

In order to solve the above technical subject, one technical means of this invention is to provide, in a magnetron sputtering apparatus for forming a thin film on a substrate by adhering metal atoms or ions evaporated to the substrate comprising one or a plurality of magnetron evaporation sources evaporating the metal atoms or ions and one or a plurality of auxiliary magnetic poles wherein one or a plurality of said magnetron evaporation sources and one or a plurality of said auxiliary magnetic poles are provided on the circumference of the substrate to generate magnetic lines of force surrounding the substrate.

According to this, the magnetic pole itself of the magnetron evaporation source thus may be of any type with the same polarity because of the use of the magnetic field formed by the auxiliary magnetic pole and magnetron evaporation source, and the magnetic field surrounding the substrate can be surely formed without being influenced by the number of the magnetron evaporation sources to be loaded. Consequently, the ions of the metal atoms going to the substrate can be increased without being influenced by the number of the magnetron evaporation source to form a thin film with high density on the substrate.

Another technical means of this invention is to arrange, in a magnetron sputtering apparatus for forming a thin film on a substrate by providing a plurality of magnetron evaporation sources on the circumference of the substrate and adhering metal atoms or ions evaporated from the magnetron evaporation sources to the substrate, an auxiliary magnetic pole having a polarity different from that of the outside magnetic pole of the magnetron evaporation source in the middle position of the mutually adjacent magnetron evaporation sources.

According to this, the magnetic field surrounding the substrate is formed by the magnetron evaporation sources and the auxiliary magnetic pole in the same manner as the above, and the adhesion or film structure of the film formed on the substrate can be improved. The magnetic pole itself of the magnetron evaporation source may be thus of any type with the same polarity, and the magnetic field surrounding the substrate can be surely formed without being influenced by the number of the magnetron evaporation sources to be loaded.

A further technical means of this invention is to provide, in a magnetron sputtering apparatus for forming a thin film on a substrate by adhering metal atoms or ions evaporated from a magnetron evaporation source to the substrate, one magnetron evaporation source and an odd number of auxiliary magnetic poles on the circumference of the substrate in such a manner that the mutually adjacent auxiliary magnetic poles have different polarities, and the outside magnetic pole of the magnetron evaporation source has a polarity different from that of the auxiliary magnetic pole adjacent thereto.

According to this, the magnetic field surrounding the substrate is formed by one magnetron evaporation source and the odd number of auxiliary magnetic poles, and the adhesion or film structure of the film formed on the substrate can be improved. The magnetic field surrounding the substrate can be also surely formed with only one magnetron evaporation source.

An even further technical means of this invention is to arrange, in a magnetron sputtering apparatus for forming a thin film on a substrate by providing a plurality of magnetron evaporation sources on the circumference of the substrate and adhering metal atoms or ions evaporated from the magnetron evaporation source to the substrate, an odd number of auxiliary magnetic poles between the mutually adjacent magnetron evaporation sources in such a manner that the mutually adjacent auxiliary magnetic poles have different polarities, and the outside magnetic pole of the magnetron evaporation source has a polarity different from that of the auxiliary magnetic pole adjacent thereto.

According to this, the magnetic pole itself of the magnetron evaporation source may be of any type with the same polarity because of the presence of the auxiliary magnetic pole, the magnetic field surrounding the substrate can be surely formed without being influenced by the number of the magnetron evaporation sources to be loaded, and the ion of the metal atom going to the substrate can be increased to form a thin film with high density on the substrate in the same manner as the above.

Another technical means of this invention is to arrange, in a magnetron sputtering apparatus for forming a thin film on a substrate by providing a plurality of magnetron evaporation sources on the circumference of the substrate and adhering metal atoms or ions evaporated from the magnetron evaporation sources to the substrate, an auxiliary magnetic pole having the same polarity as the polarity of the outside magnetic pole of the magnetron evaporation source in the middle position of the mutually adjacent magnetron evaporation sources According to this, the magnetic field surrounding the substrate is formed by the magnetron evaporation sources and the auxiliary magnetic pole in the same manner as the above, and the adhesion or film structure of the film formed on the substrate can be improved. The magnetic pole itself of the magnetron evaporation source may be of any type with the same polarity, and the magnetic field surrounding the substrate can be also surely formed without being influenced by the number of the magnetron evaporation sources to be loaded.

A further technical means of this invention is to provide, in a magnetron sputtering apparatus for forming a thin film on a substrate by adhering metal atoms or ions evaporated from a magnetron evaporation source to the substrate, one magnetron evaporation source and at least one auxiliary magnetic pole on the circumference of the substrate in such a manner that the mutually adjacent magnetic poles have the same polarity, and the outside magnetic pole of the magnetron evaporation source has the same polarity as the auxiliary magnetic pole adjacent thereto.

According to this, the magnetic field surrounding the substrate is formed by one magnetron evaporation source and at least one auxiliary magnetic pole, and the adhesion or film structure of the film formed on the substrate can be improved. The magnetic field surrounding the substrate can be surely formed with only one magnetron evaporation source.

Another technical means of this invention is to arrange, in a magnetron sputtering apparatus for forming a thin film on a substrate by providing a plurality of magnetron evaporation sources on the circumference of a substrate and adhering metal atoms or ions evaporated form the magnetron evaporation sources to the substrate, at least one auxiliary magnetic pole between the mutually adjacent magnetron evaporation sources in such a manner that the mutually adjacent auxiliary magnetic poles have the same polarity, and the outside magnetic pole of the magnetron evaporation source has the same polarity as the auxiliary magnetic pole adjacent thereto.

According to this, the magnetic pole itself of the magnetron evaporation source may be of any type with the same polarity because of the presence of the auxiliary magnetic pole, the magnetic field surrounding the substrate can be surely formed without being influenced by the number of the magnetron evaporation sources to be loaded, and the ions of the metal atoms going to the substrate can be increased in the same manner as the above to form a thin film with high density on the substrate.

A further technical means of this invention is to use an unbalanced magnetron evaporation source 3 in which the intensity of the outside magnetic pole for forming the magnetron is higher than that of an inside magnetic pole as the above magnetron evaporation source.

According to this, the magnetic lines of force leaked from the magnetron evaporation source itself to the auxiliary magnetic pole can enhance the intensity of the magnetic field surrounding the substrate.

Another technical means of this invention is to form the auxiliary magnetic pole of a permanent magnet, and making it movable in the direction approaching to and separating from the substrate.

According to this, the shape or intensity of the whole sealing magnetic field can be changed by the auxiliary magnetic pole even if the arrangement of the magnetron evaporation source remains fixed, and an optimum magnetic field form can be set according to the size of the substrate to be arranged.

A further technical means of this invention is to form the auxiliary magnetic pole of a magnetic coil, so that the shape or intensity of the magnetic field can be changed by changing the coil current.

According to this, the magnetic field can be regulated by changing the coil current of the auxiliary magnetic pole to form an optimum magnetic field according to the size of the substrate to be arranged.

Another technical means of this invention is to arrange the auxiliary magnetic pole on the atmospheric side of a vacuum chamber containing the substrate.

According to this, the problems of cooling of the auxiliary magnetic pole and vacuum sealing can be eliminated, and the apparatus structure can be simplified.

DESCRIPTION OF THE PREFERRED EMBODIMENTS

Preferred embodiments of this invention will next be described with reference to the drawings.

Figure 1:
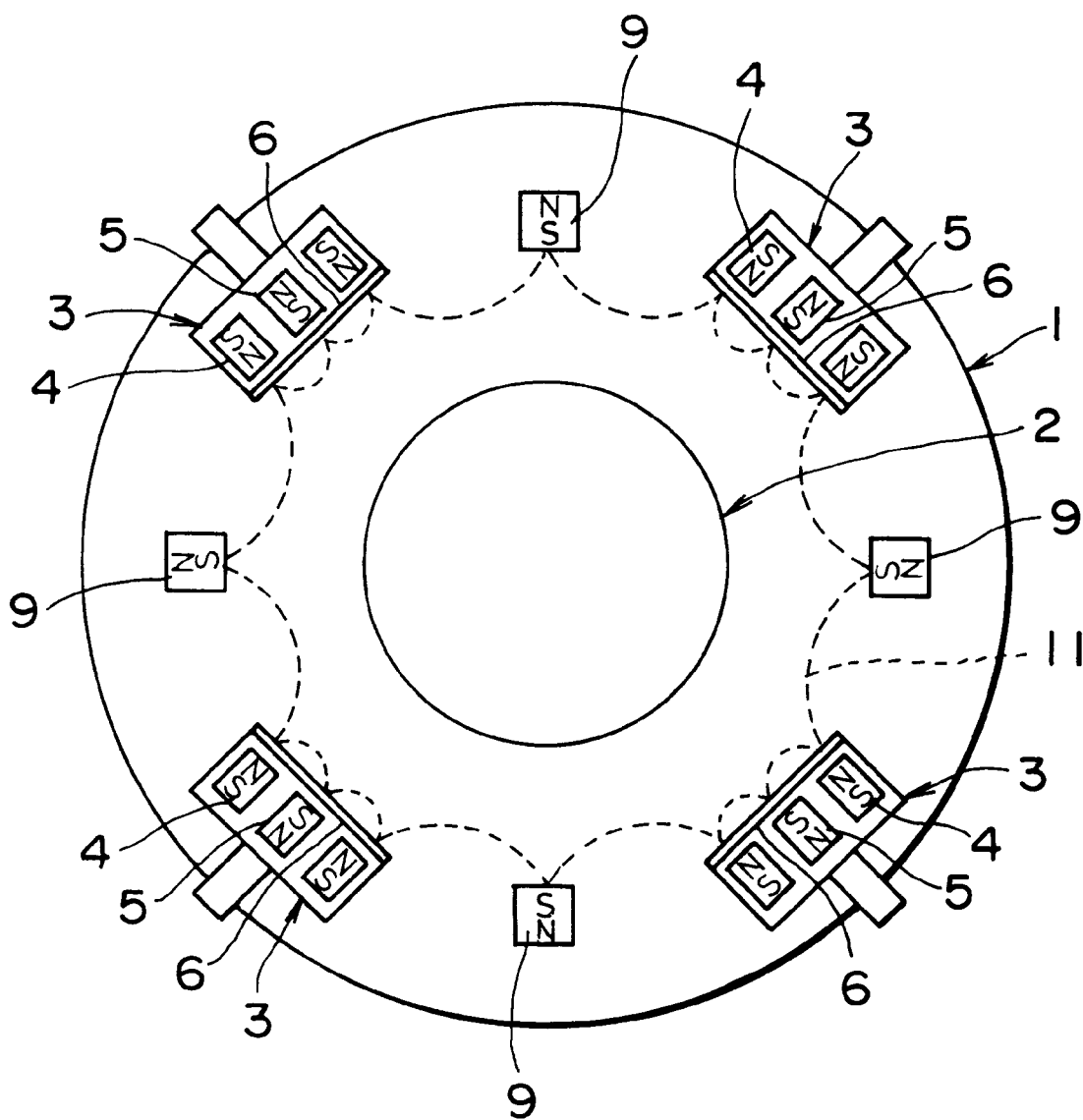
FIG. 1 is a structural view showing one embodiment of this invention.

FIG. 1 shows a magnetron sputtering apparatus having four unbalanced magnetron sputtering evaporation sources loaded thereon as a typical preferred embodiment of this invention.

In FIG. 1, a substrate (a matter to be evaporated) 2 is provided in the center part within a vacuum chamber 1, and four magnetron evaporation sources 3 are provided within the vacuum chamber 1 so as to surround the circumference of the substrate 2. Each magnetron evaporation source 3 is of the same structure, and it is provided with ring-like outside magnetic poles 4, an inside magnetic pole 5 arranged in the center of the outside magnetic poles 4, and a target 6 formed of a source material. Each magnetron evaporation source 3 is formed of an unbalanced magnetron evaporation source in which the intensity of the outside magnetic pole 4 forming a magnetron is higher than that of the inside magnetic pole 5.

Each magnetron evaporation source 3 is circularly arranged at equal intervals on the circumference of the substrate 2, and situated in a position having an equal distance from the substrate 2. An auxiliary magnetic pole 9 is provided in each center position of the mutually adjacent magnetron evaporation sources 3. The auxiliary magnetic pole 9 is formed of a permanent magnet, and movable in the direction approaching to and separating from the substrate 2. Each auxiliary magnetic pole 9 is arranged so as to have a polarity different from the polarity of the outside magnetic pole 4 of the magnetron evaporation source 3, and magnetic lines of force 11 is generated so as to successively and alternately connect the outside magnetic pole 4 of each magnetron evaporation source 3 to each auxiliary magnetic pole 9, whereby the magnetic field surrounding the substrate 2 is formed by the magnetron evaporation sources 3 and the auxiliary magnetic poles 9 so that the plasma generated from the magnetron evaporation source 3 can be sealed around the substrate 2.

According to the above embodiment, an inert gas such as argon is injected into the vacuum chamber 1, and when a minus voltage is applied to each magnetron evaporation source 3 by a sputtering power source (not shown) to the earthed vacuum chamber 1, a glow discharge is caused between the vacuum chamber 1 and each magnetron evaporation source 3 to generate a plasma (electron and argon ion) within the vacuum chamber 1. The argon ion present in the vacuum chamber 1 is collided to the target 6 of the magnetron evaporation source 3 formed of the source material, whereby metal atoms are evaporated (sputtered) from the magnetron evaporation source 3 (target 6) and adhered onto the substrate 2 to form a thin film. The metal atoms are partially ionized in the vacuum chamber 1 and adhered to the negatively biased substrate 2 with a higher energy.

Since the auxiliary magnetic poles 9 having a polarity different from the polarity of the outside magnetic pole 4 of the magnetron evaporation source are arranged in the middle position of a plurality of magnetron evaporation sources 3, the magnetic lines of force 11 are generated so as to successively connect the outside magnetic pole 4 of each magnetron evaporation source 3 to each auxiliary magnetic pole 9, whereby the magnetic field surrounding the substrate 2 is formed by the magnetron evaporation sources 3 and the auxiliary magnetic poles 9 in the same manner as the prior arts, so that the plasma generated by the glow discharge (electron and argon ion) can be sealed around the substrate 2. Thus, since the plasma generated from the magnetron evaporation source 3 is present much around the substrate 2, and ionization of the metal atoms evaporated from the magnetron evaporation source 3 is also promoted, the film formed on the substrate 2 receives the collision of argon ion or metal ion much more, whereby the adhesion between the film and the substrate 2 or the film structure of the film can be improved.

Since the auxiliary magnetic pole 9 is present between the magnetron evaporation sources 3, the magnetic pole itself of the magnetron evaporation source may be of any type with the same polarity, and the magnetic field surrounding the substrate 2 can be surely formed without being influenced by the number of the magnetron evaporation sources 3 to be loaded.

Further, the magnetic lines of force leaked from the magnetron evaporation source 3 itself to the auxiliary magnetic pole 9 can enhance the intensity of the magnetic field surrounding the substrate 2 by using, as the magnetron sputtering evaporation source 3, the unbalanced magnetron evaporation source in which the intensity of the outside magnetic pole 4 for forming the magnetron is higher than that of the inside magnetic pole 5.

Further, the shape or intensity of the whole sealing magnetic field can be changed as the arrangement of the magnetron evaporation source 3 remains fixed by forming the auxiliary magnetic pole 9 of a permanent magnet, and making its position variable to the directions of the substrate 2, and an optimum magnetic field can be set according to the size of the substrate 2 to be arranged.

Figure 2:
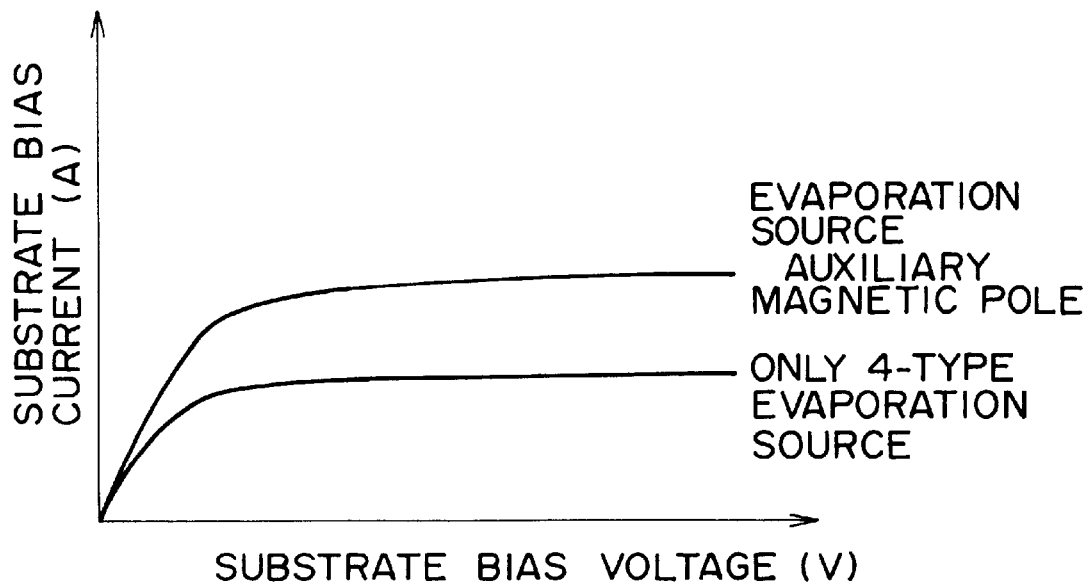
FIG. 2 is a graph showing the relation between substrate bias current and substrate bias voltage of the same.

FIG. 2 shows the measurement result of bias current of the substrate 2 in the formation of argon gas plasma with respect to the case having the auxiliary magnetic pole 9 and the case having no auxiliary magnetic pole 9 in the embodiment shown in FIG. 1. According to this measurement result, the bias current of the substrate 2 was increased by the arrangement of the auxiliary magnetic pole 9, and the magnetic field sealing effect was confirmed.

Figure 3:
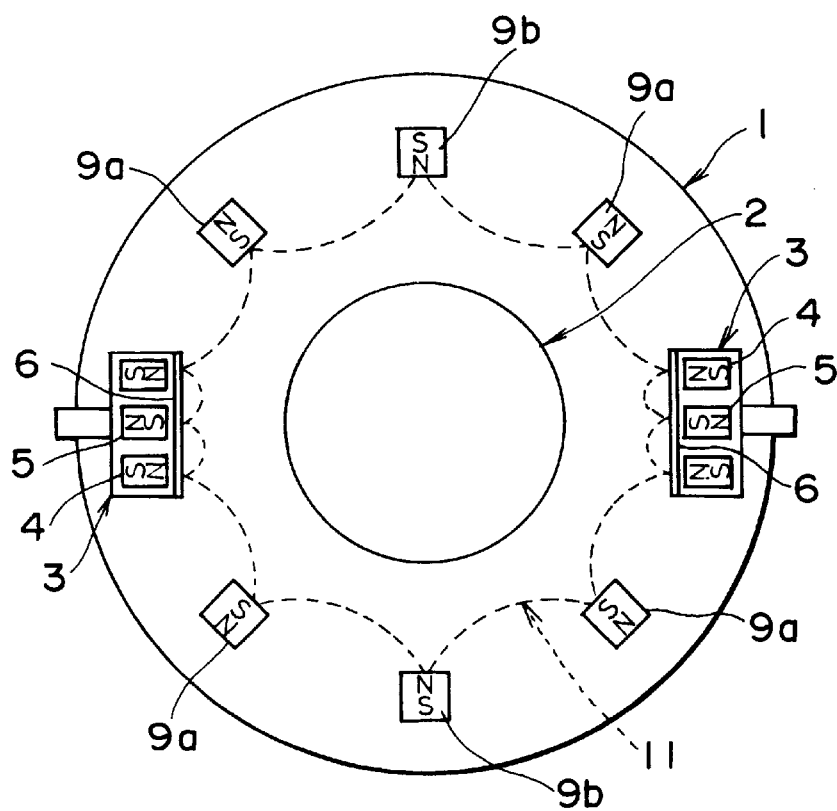
FIG. 3 is a structural view showing another embodiment of this invention.

FIG. 3 shows another embodiment of this invention, wherein two magnetron evaporation sources 3 are provided on the circumference of a substrate 2, the magnetron evaporation sources 3 are arranged so as to be conformed to the radial direction around the substrate 2, and three auxiliary magnetic poles 9 (auxiliary magnetic poles 9a, 9b, 9a) are arranged at equal intervals between the mutually adjacent magnetron evaporation sources 3, so that the circumference of the substrate 2 is surrounded by each magnetron evaporation source 3 and each auxiliary magnetic pole 9. Of the auxiliary magnetic poles 9, the auxiliary magnetic pole 9a adjacent to the magnetron evaporation source 3 has a polarity different from the outside magnetic pole 4 of the magnetron evaporation source 3, and the central auxiliary magnetic pole 9b has a polarity different from that of the auxiliary magnetic pole 9a adjacent to the magnetron evaporation source 3. Thus, a magnetic flux is generated so as to successively connect the outside magnetic pole 4 of each magnetron evaporation source 3 to each auxiliary magnetic pole 9, so that the circumference of the substrate 2 is surrounded by this magnetic flux. Thus, magnetic lines of force 11 surrounding the substrate 2 is formed by each magnetron evaporation source 3 and each auxiliary magnetic pole 9. This embodiment has the same structure as the above embodiment in respect to other points.

Although three auxiliary magnetic poles 9 are arranged each between the magnetron evaporation sources 3 in FIG. 3, the number of the auxiliary magnetic poles 9 may be increased if an odd number of auxiliary magnetic poles 9a and auxiliary magnetic poles 9b are alternately arranged. In this case, the plasma sealing effect can be enhanced more as the number of the auxiliary magnetic poles 9 is increased more to minimize the space between the mutually auxiliary magnetic poles 9.

Figure 4:
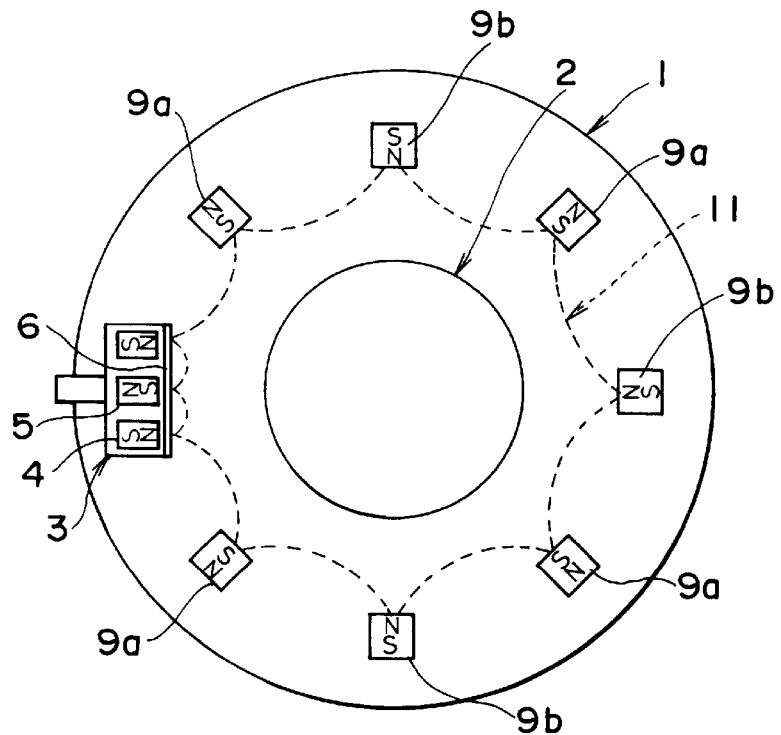
FIG. 4 is a structural view showing a further embodiment of this invention.

FIG. 4 shows a further embodiment of this invention, wherein one magnetron evaporation source 3 and an odd number of auxiliary magnetic poles 9 are provided around the substrate 2, and the circumference of the substrate 2 is surrounded by one magnetron evaporation source 3 and the odd number of auxiliary magnetic poles 9. Of the auxiliary magnetic poles 9, the auxiliary magnetic pole 9a adjacent to the magnetron evaporation source 3 has a polarity different from the outside magnetic pole 4 of the magnetron evaporation source 3, and the polarities of the auxiliary magnetic pole 9a and the auxiliary magnetic pole 9b adjacent thereto are differed. Thus, by alternately arranging the magnetron evaporation source 3 and the auxiliary magnetic poles 9a, 9b having different polarities, the magnetic flux 11 is generated so as to successively connect the outside magnetic pole 4 of the magnetron evaporation source 3 to each auxiliary magnetic pole 9, so that the circumference of the substrate 2 is surrounded by the magnetic flux 11, and the sealed magnetic field is also formed. This embodiment has the same structure as the above embodiment in respect to other points.

Figure 5:
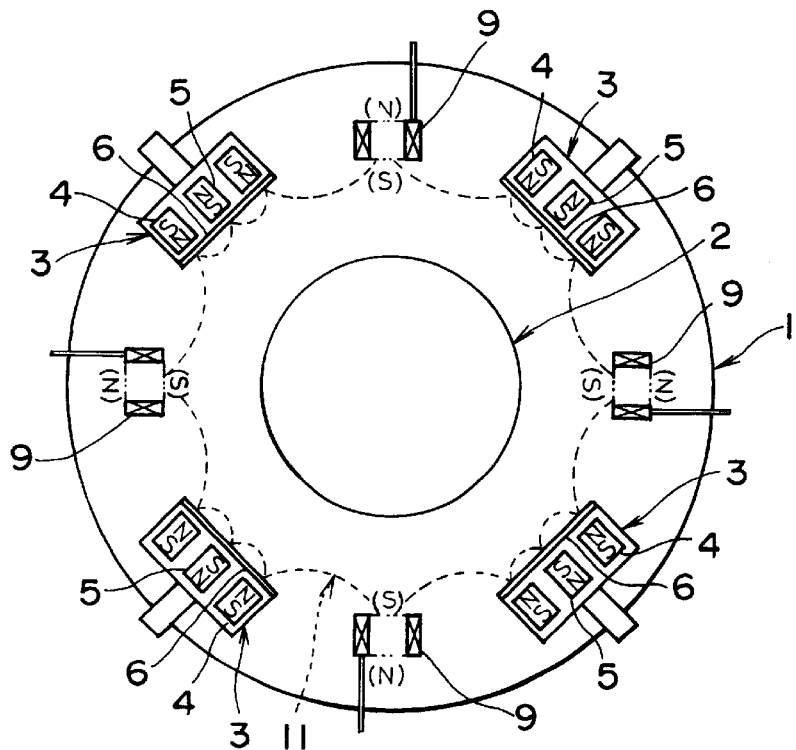
FIG. 5 is a structural view showing an even further embodiment of this invention.

FIG. 5 shows an even further embodiment of this invention, wherein an air-core coil is used as the auxiliary magnetic pole 9 instead of a permanent magnet used as the auxiliary magnetic pole 9 in each embodiment of FIGS. 1, 3, and 4, and this coil is excited so as to have a polarity different from the outside magnetic pole 4 of the magnetron evaporation source 3. Similarly to the embodiment of FIG. 1, the magnetic lines of force 11 is generated so as to successively and alternately connect the outside magnetic pole 4 of each magnetron evaporation source 3 to each auxiliary magnetic pole 9, so that the circumference of the substrate 2 is surrounded by the magnetic lines of force 11. Since the air-core coil is used as the auxiliary magnetic pole 9, further, the magnetic field form can be easily changed by changing the exciting current, and the sealing magnetic field can be regulated to form an optimum magnetic field according to the size of the substrate 2 to be arranged.

Figure 6:
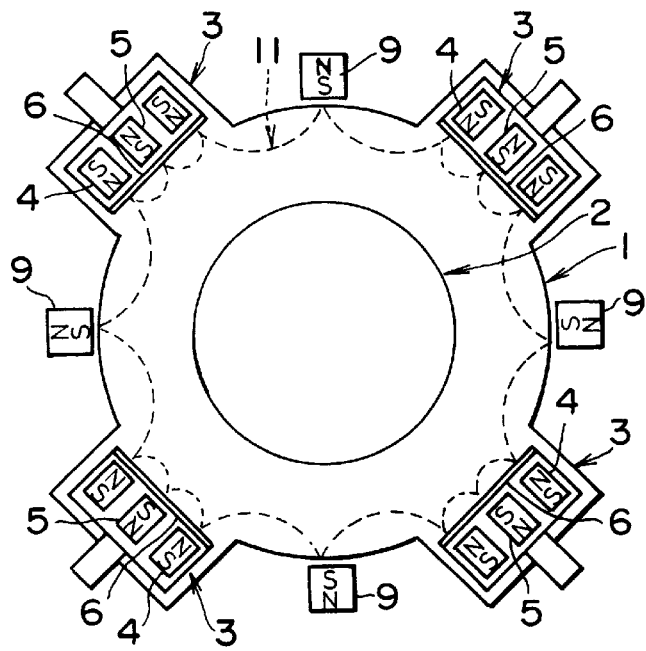
FIG. 6 is a structural view showing another embodiment of this invention.

FIG. 6 shows another embodiment of this invention, wherein the auxiliary magnetic poles 9 to be arranged between the magnetron evaporation sources 3 are arranged on the atmospheric side of the vacuum chamber 1. The distance between the magnetron evaporation source 3 and the substrate 2 is set to about the same degree as the distance between the auxiliary magnetic pole 9 and the substrate 2, so that the sealing magnetic field to be formed is as equal as possible to the substrate 2. As the auxiliary magnetic pole 9, an air-core coil may be used besides the permanent magnet shown in FIG. 6. In both the cases, the cooling mechanism for the auxiliary magnetic pole 9 and the field through for introducing the wiring of the air-core coil into the vacuum chamber 1 can be omitted, compared with the embodiments shown in FIGS. 1 and 5, and the apparatus structure can be simplified.

In this embodiment, the problems of cooling of the auxiliary magnetic pole and vacuum sealing can be eliminated by arranging the auxiliary magnetic pole 9 on the outside of the vacuum chamber 1, and the apparatus structure can be simplified.

Figure 7:
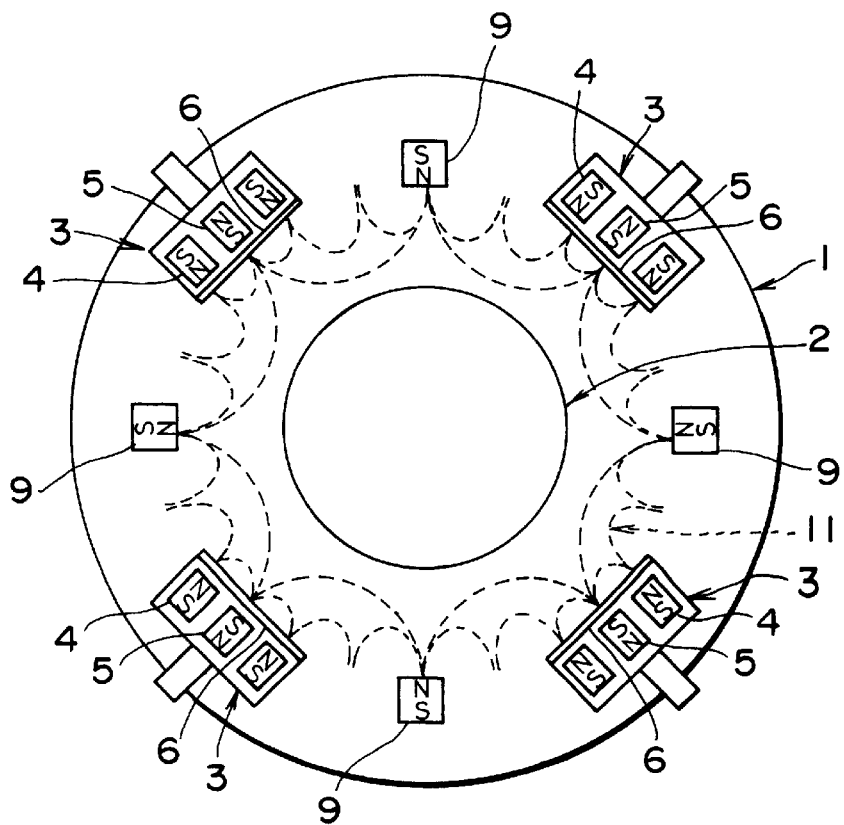
FIG. 7 is a structural view showing a further embodiment of this invention.

FIG. 7 shows a magnetron sputtering apparatus having four unbalanced magnetron sputtering evaporation source magnetrons loaded thereon as a typical other embodiment of this invention.

In FIG. 7, a substrate (matter to be evaporated) 2 is provided in the center within the vacuum chamber 1, and four magnetron evaporation sources 3 are provided within the vacuum chamber 1 so as to surround the circumference of the substrate 2. Each magnetron evaporation source 3 is of the same structure, and it is provided with ring-like outside magnetic poles 4, an inside magnetic pole 5 fitted into the center of the outside magnetic poles 4, and a target 6 formed of a source material. Each magnetron evaporation source 3 is formed of an unbalanced magnetron evaporation source in which the intensity of the outside magnetic pole 4 forming the magnetron is higher than that of an inside magnetic pole 5.

Each magnetron evaporation source 3 is circularly arranged at equal intervals on the circumference of the substrate 2, and situated in a position having an equal distance from the substrate 2. An auxiliary magnetic pole 9 is provided in each center position between the mutually adjacent magnetron evaporation sources 3. The auxiliary magnetic pole 9 is formed of a permanent magnet, and movable in the direction approaching to and separating from the substrate 2. Each auxiliary magnetic pole 9 is arranged so as to have the same polarity as that of the outside magnetic pole 4 of the magnetron evaporation source 3.

According to the above embodiment, an inert gas such as argon is injected into the vacuum chamber 1, and when a minus voltage is applied to each magnetron evaporation source 3 by a sputtering power source (not shown) in the earthed vacuum chamber 1, a glow discharge is caused between the vacuum chamber 1 and each magnetron evaporation source 3 to generate a plasma (electron and argon ion) in the vacuum chamber 1. The argon ion present in the vacuum chamber 1 is collided to the target 6 of the magnetron evaporation source 3 consisting of the source material, whereby the metal atom is evaporated (sputtered) from the magnetron evaporation source 3 (target 6) and adhered onto the substrate 2 to form a thin film. The metal atom is partially ionized within the vacuum chamber 1 and adhered to the electrically negatively biased substrate 2 with a higher energy.

At this time, since the auxiliary magnetic pole 9 having the same polarity as the outside magnetic pole 4 of the magnetron evaporation source is arranged in the middle position of a plurality of magnetron evaporation sources 3, the magnetic lines of force 11 are generated so as to repel at the middle position between the magnetron evaporation source and the auxiliary magnetic pole 9 adjacent thereto. Since the magnetic lines of force are concentrated at this area, the plasma (electron and argon ion) generated by the glow discharge can be sealed around the substrate 2 by the Miller effect. And since the magnetic field between the magnetron evaporation source 3 and the auxiliary magnetic pole 9 adjacent thereto is repelled to each other, the magnetic field in front of the magnetron evaporation source is extended more in the direction of the substrate 2, whereby a plasma of high density can be provided in the position of the substrate 2. Accordingly, since the plasma (argon ion) generated from the magnetron evaporation source 3 is present much around the substrate 2, and the ionization of the metal atom evaporated from the magnetron evaporation source 3 is also activated, the film formed on the substrate 2 receives the collision of the argon ion or metal ion much more, whereby the adhesion between the substrate 2 and the film and the film structure of the film can be improved.

Since the auxiliary magnetic pole 9 is present between the magnetron evaporation sources 3, the magnetic pole itself of the magnetron evaporation sources 3 may be of any type with the same polarity, and the magnetic field surrounding the substrate 2 can be surely formed without being influenced by the number of the magnetron evaporation sources 3 to be loaded.

The magnetic lines of force leaked from the magnetron evaporation source 3 itself to the auxiliary magnetic pole 9 can enhance the intensity of the magnetic field surrounding the substrate by using the unbalanced magnetron evaporation source in which the intensity of the outside magnetic pole 4 forming the magnetron is higher than that of the inside magnetic pole 5 as the magnetron sputtering evaporation source 3.

Further, the shape or intensity of the whole sealing magnetic field can be changed as the arrangement of the magnetron evaporation source 3 remains fixed by forming the auxiliary magnetic pole 9 of a permanent magnet, and making its position variable to the direction of the substrate 2, and an optimum field form can be set according to the size of the substrate 2 to be loaded.

Figure 8:
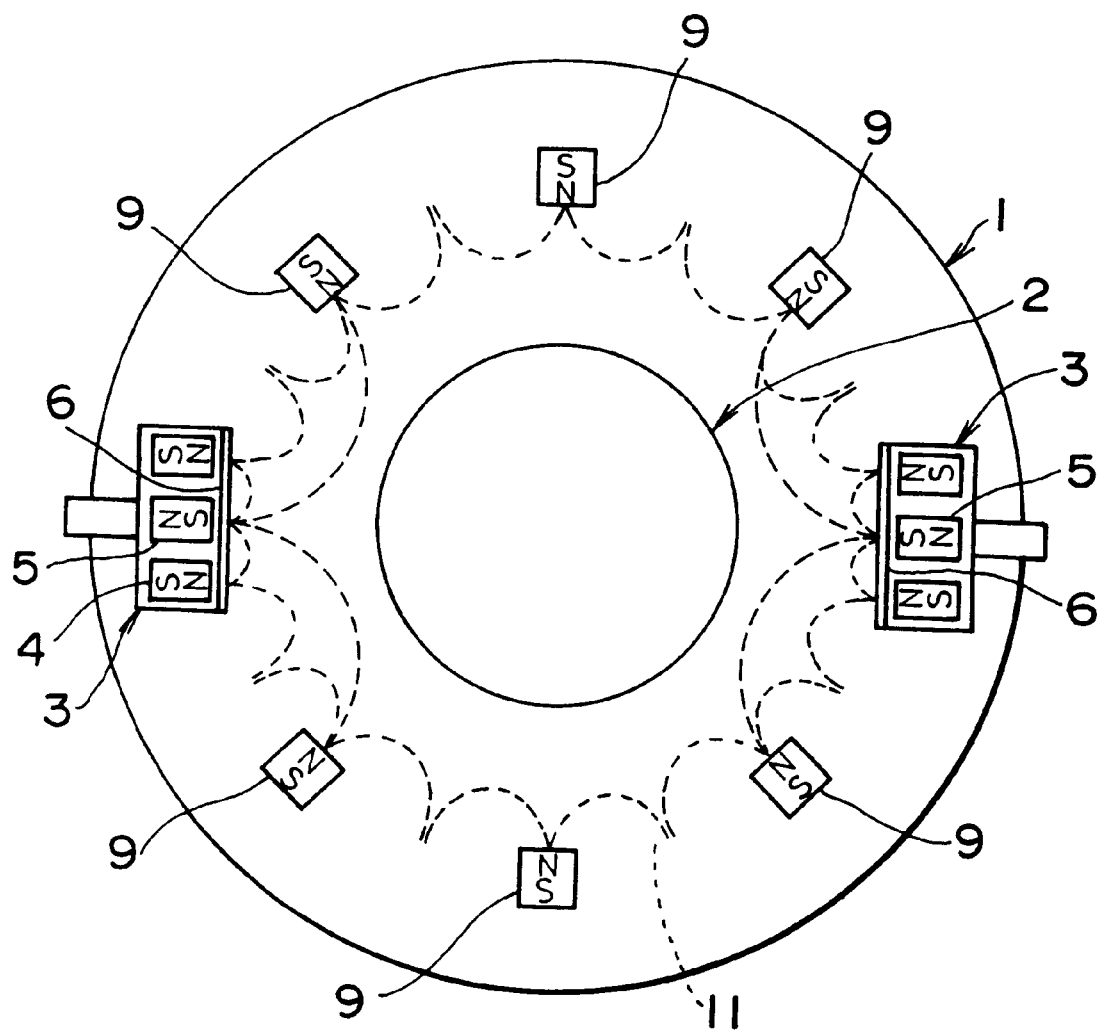
FIG. 8 is a structural view showing another embodiment of this invention.

FIG. 8 shows another embodiment of this invention, wherein two magnetron evaporation sources 3 are provided on the circumference of a substrate 2, the magnetron evaporation sources 3 are arranged so as to be conformed to the radial direction around the substrate 2, and three auxiliary magnetic poles 9 are arranged at equal intervals each between the mutually adjacent magnetron evaporation sources 3 so as to surround the circumference of the substrate 2 by each magnetron evaporation source 3 and each auxiliary magnetic pole 9. Of the auxiliary magnetic poles 9, the auxiliary magnetic pole 9 adjacent to the magnetron evaporation source 3 has the same polarity as the outside magnetic pole 4 of the magnetron evaporation source 3, and the central auxiliary magnetic pole 9 has the same polarity as the auxiliary magnetic pole 9 adjacent to the magnetron evaporation source 3. Thus, the magnetic field is generated so as to repel at the middle position between the magnetron evaporation source 3 and the auxiliary magnetic pole 9 adjacent thereto or between the mutually adjacent auxiliary magnetic poles 9. Since the magnetic lines of force are concentrated at this area, the plasma (electron and argon ion) generated by the glow discharge can be sealed around the substrate 2 by the Miller effect. And since the magnetic field between the magnetron evaporation source 3 and the auxiliary magnetic pole 9 adjacent thereto is repelled to each other, the magnetic field in front of the magnetron evaporation source is extended more in the direction of the substrate 2, whereby a plasma of high density can be provided in the position of the substrate 2. Accordingly, since the plasma (argon ion) generated from the magnetron evaporation source 3 is present much around the substrate 2, and the ionization of the metal atom evaporated from the magnetron evaporation source 3 is also activated, the film formed on the substrate 2 receives the collision of the argon ion or metal ion much more, whereby the adhesion between the substrate 2 and the film and the film structure of the film can be improved. This embodiment has the same structure as the above embodiment in respect to other points.

Although the three auxiliary magnetic poles 9 are arranged each between the magnetron evaporation sources 3 in FIG. 8, the number of the auxiliary magnetic poles 9 may be further increased. In this case, the plasma sealing effect can be more enhanced as the number of the auxiliary magnetic poles 9 is increased more to minimize the space between the auxiliary magnetic poles 9.

Figure 9:
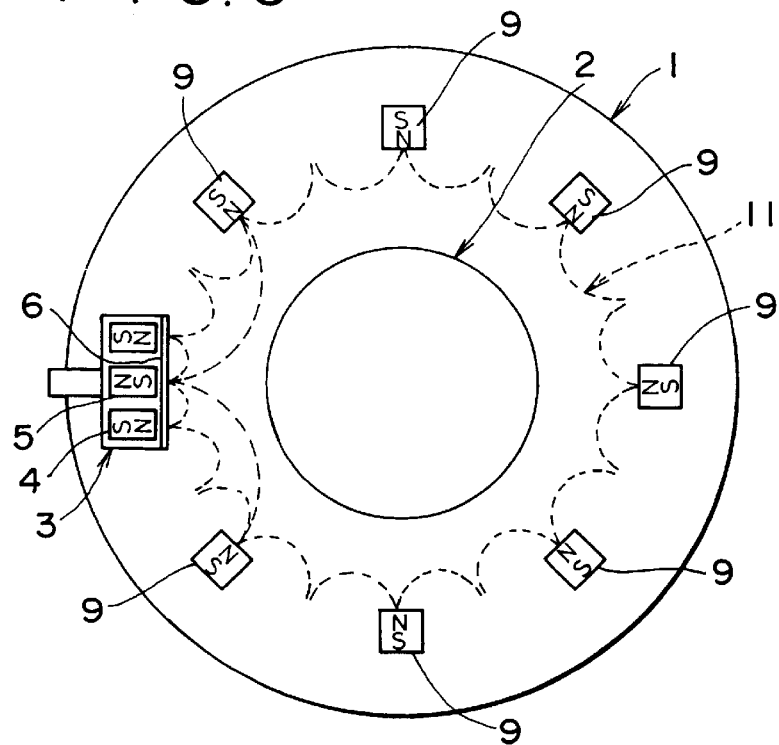
FIG. 9 is a structural view showing a further embodiment of this invention.

FIG. 9 shows a further embodiment of this invention, wherein one magnetron evaporation source 3 and a plurality of auxiliary magnetic poles 9 are provided on the circumference of a substrate 2 so as to surround the circumference of the substrate 2 by one magnetron evaporation source 3 and a plurality of auxiliary magnetic poles 9. Of the auxiliary magnetic poles 9, the auxiliary magnetic pole 9 adjacent to the magnetron evaporation source 3 has the same polarity as the outside magnetic pole 4 of the magnetron evaporation source 3, and the mutually adjacent auxiliary magnetic poles 9 have the same polarity. Thus, the magnetic field is generated so as to repel at the middle position between the magnetron evaporation source 3 and the auxiliary magnetic pole 9 adjacent thereto or between the mutually adjacent auxiliary magnetic poles 9. Since the magnetic lines of force are concentrated at this area, the plasma (electron and argon ion) generated by the glow discharge can be sealed around the substrate 2 by the Miller effect. And since the magnetic field between the magnetron evaporation source 3 and the auxiliary magnetic pole 9 adjacent thereto is repelled to each other, the magnetic field in front of the magnetron evaporation source is extended more in the direction of the substrate 2, whereby a plasma of high density can be provided in the position of the substrate 2. Accordingly, since the plasma (argon ion) generated from the magnetron evaporation source 3 is present much around the substrate 2, and the ionization of the metal atoms evaporated from the magnetron evaporation source 3 is also activated, the film formed on the substrate 2 receives the collision of the argon ion or metal ion much more, whereby the adhesion between the substrate 2 and the film and the film structure of the film can be improved. This embodiment has the structure as the above embodiment in respect to other points.

Figure 10:
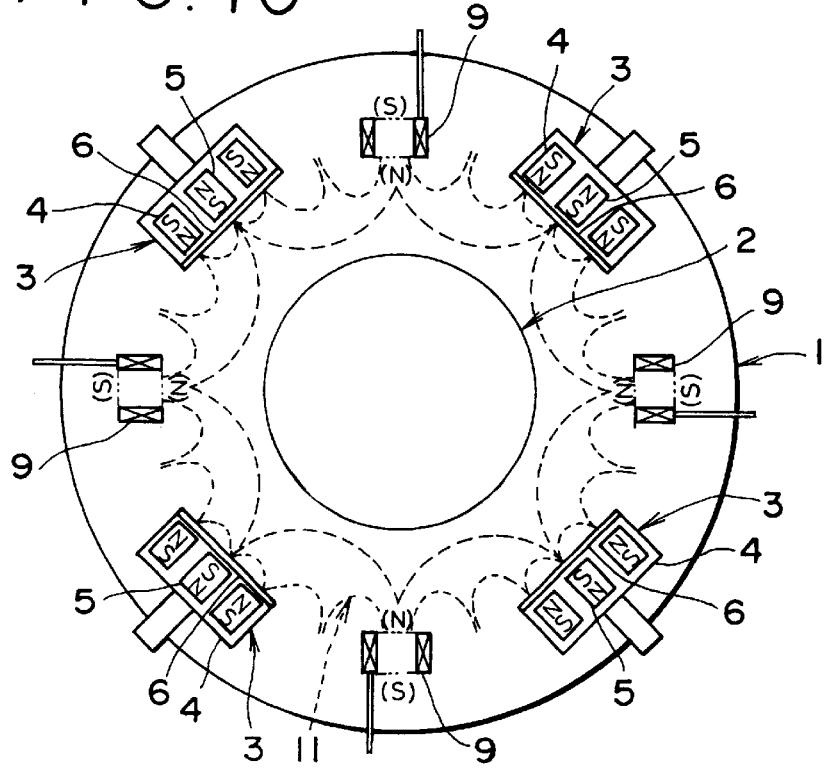
FIG. 10 is a structural view showing another embodiment of this invention.

FIG. 10 shows another embodiment of this invention, wherein an air-core coil is used as the auxiliary magnetic pole 9 instead of the permanent magnet used as the auxiliary magnetic pole 9 in each embodiment of FIGS. 7, 8 and 9. In this case, also, the magnetic lines of force 11 is generated similar to the case of permanent magnet, so that the circumference of the substrate 2 is surrounded by the magnetic lines of force 11. Since the air-core coil is used as the auxiliary magnetic pole 9, the magnetic field form can be easily changed by changing the exciting current, and the sealing magnetic field can be regulated to form an optimum magnetic field according to the size of the substrate 2 to be arranged.

Figure 11:
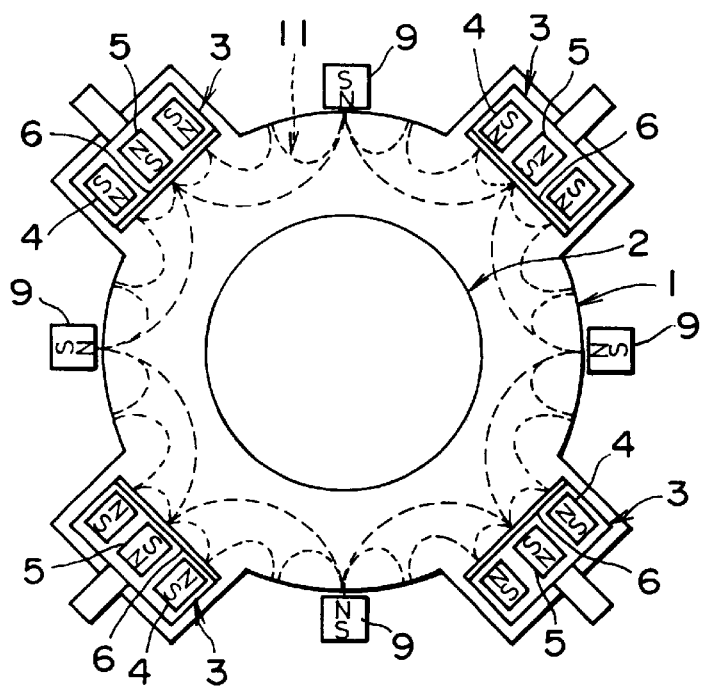
FIG. 11 is a structural view showing a further embodiment of this invention.
Figure 12:
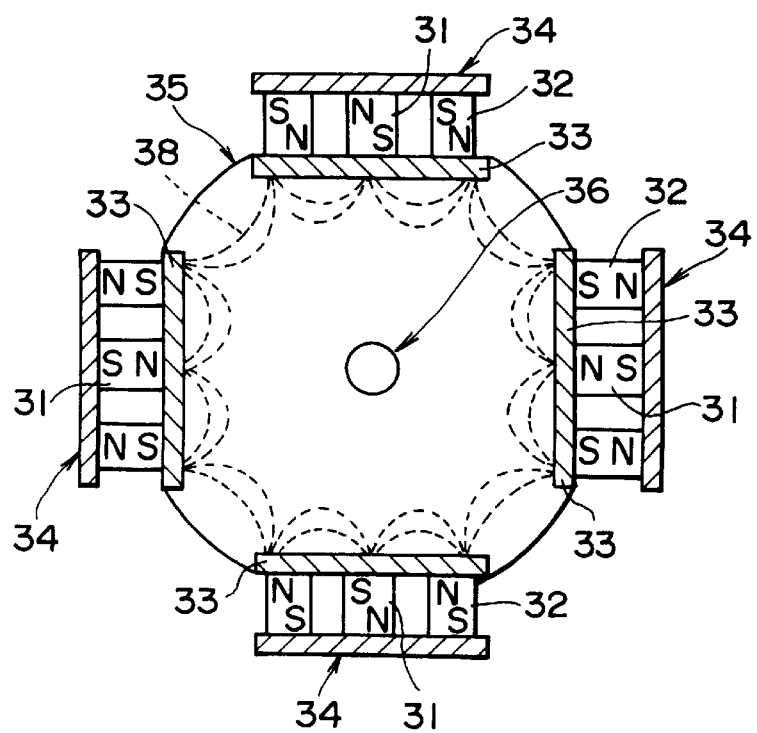
FIG. 12 is a structural view showing a conventional example.

FIG. 11 shows a further embodiment of this invention, wherein the auxiliary magnetic pole 9 to be arranged between the magnetron evaporation source 3 is arranged on the atmospheric side of the vacuum chamber 1. The distance between the magnetron evaporation source 3 and the substrate 2 is set to about the same degree as the distance between the auxiliary magnetic pole 9 and the substrate 2, so that the formed sealing magnetic field is as even as possible to the substrate 2. As the auxiliary magnetic pole 9, an air-core coil can be used besides the permanent magnet shown in FIG. 11. In both the cases, the cooling mechanism for the auxiliary magnetic pole 9 and the field through for introducing the wiring of the air-core coil into the vacuum chamber 1 can be omitted, and the apparatus structure can be simplified.

In this embodiment, the problems of cooling of the auxiliary magnetic pole and vacuum sealing can be eliminated by arranging the auxiliary magnetic pole 9 on the outside of the vacuum chamber 1, and the apparatus structure can be simplified.

Further, the auxiliary magnetic pole 9 is formed of a permanent magnet or coil arranged on the atmospheric side of the vacuum chamber 1 and a magnetic body arranged in a position corresponding thereto within the vacuum chamber 1, whereby the magnetic lines of force generated in the permanent magnet or coil on the outside of the vacuum chamber 1 can be introduced into the chamber 1 while minimizing the loss thereof, so that the structure can be simplified, and the reduction in intensity of the sealing magnetic field can be also prevented.

According to this invention, one type of magnetron magnetic field structure suffices for the magnetron evaporation source 3. A desired sealing magnetic field can be formed regardless of the number or arrangement of the magnetron evaporation sources 3. Further, the form of the sealing magnetic field can be easily changed.

While the invention has been described in detail and with reference to specific embodiments thereof, it will be apparent to one skilled in the art that various changes and modifications can be therein without departing from the spirit and scope thereof.

The entire disclosure of the Japanese Patent Application No. 10-232927 filed on Aug. 19, 1998 including specification, claims, drawings and summary are incorporated herein by reference in its entirety.

What is claimed is:

1. A magnetron sputtering apparatus for forming a thin film on a substrate, comprising:

a plurality of magnetron evaporation sources configured to evaporate metal atoms or ions to the substrate, each of the plurality of magnetron evaporation sources having a same structure; and a plurality of auxiliary magnetic poles not operating as a magnetron evaporation source, wherein the plurality of magnetron evaporation sources and the plurality of auxiliary magnetic poles are provided on a circumference of the substrate to generate magnetic lines of force surrounding the substrate.

2. The magnetron sputtering apparatus of claim 1, wherein a single auxiliary magnetic pole of the plurality of auxiliary magnetic poles is arranged in a middle position between mutually adjacent magnetron evaporation sources and has a polarity different from an outside magnetic pole of the plurality of magnetron evaporation sources.

3. The magnetron sputtering apparatus of claim 1, wherein an odd number of said auxiliary magnetic poles are provided between mutually adjacent magnetron evaporation sources in such a manner that mutually adjacent auxiliary magnetic poles have different polarities, and an outside magnetic pole of said plurality of magnetron evaporation sources has a polarity different from an adjacent auxiliary magnetic pole.

4. The magnetron sputtering apparatus of claim 1, wherein an auxiliary magnetic pole of said plurality of auxiliary magnetic poles with a same polarity as an outside magnetic pole of said plurality of magnetron evaporation sources is arranged in a middle position between mutually adjacent magnetron evaporation sources.

5. The magnetron sputtering apparatus of claim 1, wherein mutually adjacent auxiliary magnetic poles have a same polarity, and an outside magnetic pole of said plurality of magnetron evaporation sources has a same polarity as an adjacent auxiliary magnetic pole.

6. The magnetron sputtering apparatus of claim 1, wherein said plurality of magnetron evaporation sources comprise an unbalanced magnetron evaporation source in which an intensity of an outside magnetic pole for forming the magnetron is higher than an inside magnetic pole.

7. The magnetron sputtering apparatus of claim 1, wherein said plurality of auxiliary magnetic poles comprise a permanent magnet, and are movable in a direction approaching to and separating from the substrate.

8. The magnetron sputtering apparatus of claim 1, wherein said plurality of auxiliary magnetic poles comprise a magnetic coil, so that a shape and an intensity of a magnetic field can be changed by changing a coil current.

9. The magnetron sputtering apparatus of claim 1, wherein said plurality of auxiliary magnetic poles are arranged on an atmospheric side of a vacuum chamber containing the substrate.

10. A magnetron sputtering apparatus for forming a thin film on a substrate, comprising:

a single magnetron evaporation source configured to evaporate metal atoms or ions to the substrate; and a plurality of auxiliary magnetic poles, wherein the single magnetron evaporation source and the plurality of auxiliary magnetic poles are circularly arranged at substantially continuous equal intervals on a circumference of the substrate to generate magnetic lines of force surrounding the substrate.

11. The magnetron sputtering apparatus of claim 10, wherein mutually adjacent auxiliary magnetic poles have a same polarity, and an outside magnetic pole of said single magnetron evaporation source has a same polarity as an adjacent auxiliary magnetic pole.

12. The magnetron sputtering apparatus of claim 10, wherein said single magnetron evaporation source comprises an unbalanced magnetron evaporation source in which an intensity of an outside magnetic pole for forming the magnetron is higher than an inside magnetic pole.

13. The magnetron sputtering apparatus of claim 10, wherein said plurality of auxiliary magnetic poles comprise a permanent magnet, and are movable in a direction approaching to and separating from the substrate.

14. The magnetron sputtering apparatus of claim 10, wherein said plurality of auxiliary magnetic poles comprise a magnetic coil, so that a shape and an intensity of a magnetic field can be changed by changing a coil current.

15. The magnetron sputtering apparatus of claim 10, wherein said plurality of auxiliary magnetic poles are arranged on an atmospheric side of a vacuum chamber containing the substrate.

* * * * *